(12) United States Patent
Eberlein

(10) Patent No.: US 11,015,985 B2
(45) Date of Patent: May 25, 2021

(54) TIME-CONTROLLED SWITCH CAPACITOR BASED TEMPERATURE SENSOR

(71) Applicant: Intel Corporation, Santa Clara, CA (US)

(72) Inventor: Matthias Eberlein, Holzkirchen (DE)

(73) Assignee: Intel IP Corporation, Santa Clara, CA (US)

( * ) Notice: Subject to any disclaimer, the term of this patent is extended or adjusted under 35 U.S.C. 154(b) by 405 days.

(21) Appl. No.: 15/942,163

(22) Filed: Mar. 30, 2018

(65) Prior Publication Data

US 2019/0041272 A1 Feb. 7, 2019

(51) Int. Cl.
| | |
|---|---|
| *G01K 7/00* | (2006.01) |
| *G01K 7/01* | (2006.01) |
| *H03H 19/00* | (2006.01) |
| *H01L 23/34* | (2006.01) |

(52) U.S. Cl.
CPC ............ *G01K 7/01* (2013.01); *H03H 19/004* (2013.01); *G01K 2219/00* (2013.01); *H01L 23/34* (2013.01)

(58) Field of Classification Search
USPC ........................................ 374/178, 163, 170
See application file for complete search history.

(56) References Cited

U.S. PATENT DOCUMENTS

| | | | | |
|---|---|---|---|---|
| 5,982,221 A | * | 11/1999 | Tuthill ..................... | G01K 7/01 257/E23.08 |
| 6,060,874 A | | 5/2000 | Doorenbos | |
| 6,097,239 A | * | 8/2000 | Miranda, Jr. ............ | G01K 7/01 327/512 |
| 6,847,319 B1 | * | 1/2005 | Stockstad ................ | G01K 7/01 341/119 |
| 6,869,216 B1 | * | 3/2005 | Holloway ............... | G01K 1/028 341/143 |
| 7,010,440 B1 | * | 3/2006 | Lillis ........................ | G01K 7/01 327/512 |
| 7,312,648 B2 | * | 12/2007 | Yang ........................ | G01K 7/01 327/512 |
| 10,061,336 B1 | | 8/2018 | Shor | |

(Continued)

FOREIGN PATENT DOCUMENTS

| | | |
|---|---|---|
| KR | 20090104361 | 10/2009 |
| WO | 2017105554 | 6/2017 |

OTHER PUBLICATIONS

Hellen, Edward H., "Verifying the diode-capacitor circuit voltage decay", 2003 American Association of Physics Teachers, 4 pgs.

(Continued)

*Primary Examiner* — Mirellys Jagan
(74) *Attorney, Agent, or Firm* — Green, Howard & Mughal LLP

(57) ABSTRACT

An apparatus comprises: a first circuitry to charge first and second capacitors to a predetermined voltage level; a second circuitry to discharge the first capacitor through a diode at a first time; a third circuitry to discharge the second capacitor through the diode at a second time, wherein the second time is greater than the first time; a comparator to compare a first voltage of the first capacitor with a second voltage of the second capacitor; and logic to adjust a scaling factor applied to the second voltage according to an output of the comparator.

19 Claims, 10 Drawing Sheets

(56) References Cited

U.S. PATENT DOCUMENTS

| | | |
|---|---|---|
| 2003/0090277 A1* | 5/2003 | Lechner .................. G01K 7/34 324/686 |
| 2007/0035973 A1 | 2/2007 | Kitazaki et al. |
| 2011/0102058 A1* | 5/2011 | Conte ................. H03F 3/45183 327/512 |
| 2016/0224146 A1 | 8/2016 | Malevsky |
| 2017/0089765 A1 | 3/2017 | Eberlein |
| 2017/0285680 A1 | 10/2017 | Eberlein et al. |
| 2019/0041272 A1 | 2/2019 | Eberlein |

OTHER PUBLICATIONS

Eberlein, Matthias et al., "Time-Controlled and FinFET Compatible Sub-Bandgap References using Bulk-Diodes", Circuits and Systems II: Express Briefs, IEEE Transactions on, Jul. 2019, 5 pgs.

* cited by examiner

TIME-CONTROLLED SWITCH CAPACITOR BASED TEMPERATURE SENSOR

BACKGROUND

Thermal management becomes increasingly critical, especially with high computing power of mobile devices (e.g., 4G modems, 5G communication devices). Most existing temperature sensor concepts evaluate the Vbe voltage (base-emitted voltage) of a bipolar transistor used as sensing element (NPN or PNP parasitic device in digital Complementary Metal Oxide Semiconductor (CMOS)). Yet several measures are required to achieve linearity, including two-point trim, chopping, low-noise supply, or specific process features. For precise measurements of temperature, conventional thermal sensors in such devices or systems usually rely on parasitic PNP components (e.g., parasitic PNP bipolar transistors). However, in some fabrication technologies, the quality of such PNP components may degrade drastically due to factors such as micro-defects in junctions (e.g., emitter-base junction) in the PNP components. Further, some conventional thermal sensors may need multi-point trim for sensing adjustment in order to meet specific measurement accuracy. Moreover, in some fabrication processes, options for forming such PNP components in the device may be limited or may be non-existent. Thus, for the at least reasons mentioned herein, designing thermal sensors in some conventional devices may pose a challenge.

Especially, circuits for "classic sensors" tend to be very complex, as they combine bandgap reference, sigma-delta analog-to-digital converter, clocking, etc. Existing temperature sensors are not scaling and have challenges when implemented in FinFET (fin Field Effect Transistors) based technologies. Sufficient performance is achieved only through costly trimming and high complexity, impacting area and power.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
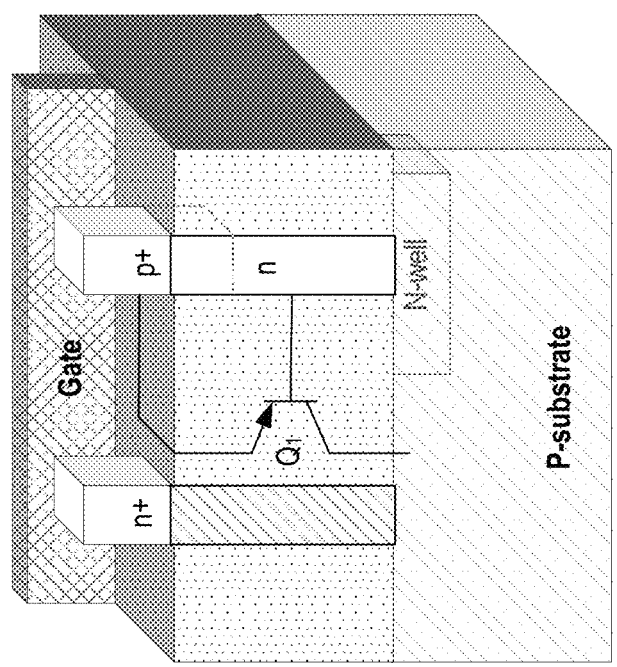
FIG. 1 illustrates a PNP bipolar junction in a FinFET process technology node.

To enable multi-spot temperature sensing on small grid, a sensor solution requires: high accuracy (e.g., error less than 5° C.), scaling and FinFET compatible, low voltage operation (e.g., supply less than 1.1 V), low test cost (e.g., to avoid trim points), low system overhead ("smart" digital output), small area (less than 4000 μm$^2$). It is a challenge for classic circuits to meet the above criteria using bandgap reference type circuits.

Some embodiments, use an N-well-to-substrate junction, available in all CMOS and FinFET process technology nodes, as a thermal sensing element. This diode formed from such junction is usually of high quality, and typically in reverse bias configuration (e.g., because the p-type substrate may be tied to ground). In some embodiments, capacitive bias is applied to the diode instead of the traditional technique of using ratioed resistors and/or current sources to bias the diode(s). As such, a nearly-digital circuit is realized that is used to determine a current density precisely by timing control. In this way, a forward-bias diode voltage can be sampled with a capacitor, and large current ratios are possible (e.g., ratio N greater than 1000).

There are many technical effects of the thermal sensor circuit of the various embodiments. For example, the thermal sensors of various embodiments are a digital-friendly concept that uses digitally controlled transistors as switches to charge and discharge the capacitors and to bias the diode. The diode of various embodiments is robust because it is an N-well diode which is buried in the die and does not degrade by process scaling or non-uniform doping, or surface defects, as they are present especially for junctions within FinFET structures. As such, the temperature sensing element of various embodiments is a robust element. The temperature sensing architecture of various embodiments is simple in that it uses a two-terminal diode for sensing instead of the three-terminal PNP based diode. As such, fewer process parameters are involved in realizing the diode. The temperature sensing architecture of various embodiments is smaller in area and complexity compared to traditional sensors that use ratioed-resistor, current sources, and PNP based sensing elements. The temperature sensing architecture of various embodiments can operate at low power supplies, such as a 0.85 V power supply, and intrinsically has power supply rejection ratio (PSRR) because the design is timing based. The temperature sensing architecture of various embodiments has higher accuracy than traditional temperature sensors because it uses zero or one-point trimming of the sensor to achieve less than 5-degree Celsius error. The term "trimming" is a term of art for thermal sensors which is used to calibrate the sensor by adjusting device parameters such as input offset, current density, etc. to mitigate sensing errors and to calibrate the accuracy of the sensor. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

It is pointed out that elements of a figure having the same reference numbers (or names) as the elements of any other figure can operate or function in any manner similar to that described but are not limited to such.

FIG. 1 illustrates a PNP bipolar junction 100 in a FinFET process technology node. Traditional thermal sensors use PNP or NPN based bipolar transistor junction (BJT) for sensing temperature. The BJT, as shown in FIG. 1 is formed by the PNP junction using a source terminal, the N-well, and the p-type substrate. However, one major issue with BJT based thermal sensors is that they use a costly trimming process that requires extra circuitry and time. The complexity of the trimming process where the thermal sensor is calibrated to cancel for errors, increases the area and test effort. The BJT used for thermal sensors also exhibits poor linearity as the process scales. In FinFET process technology nodes, the parasitic PNP suffers from inhomogeneous (e.g., leaky) p-n junctions, squeezed between the fins as shown in FIG. 1. Electrical characteristic for just a BJT is unstable due to large base-width (e.g., the width of the N-well).

Figure 2:
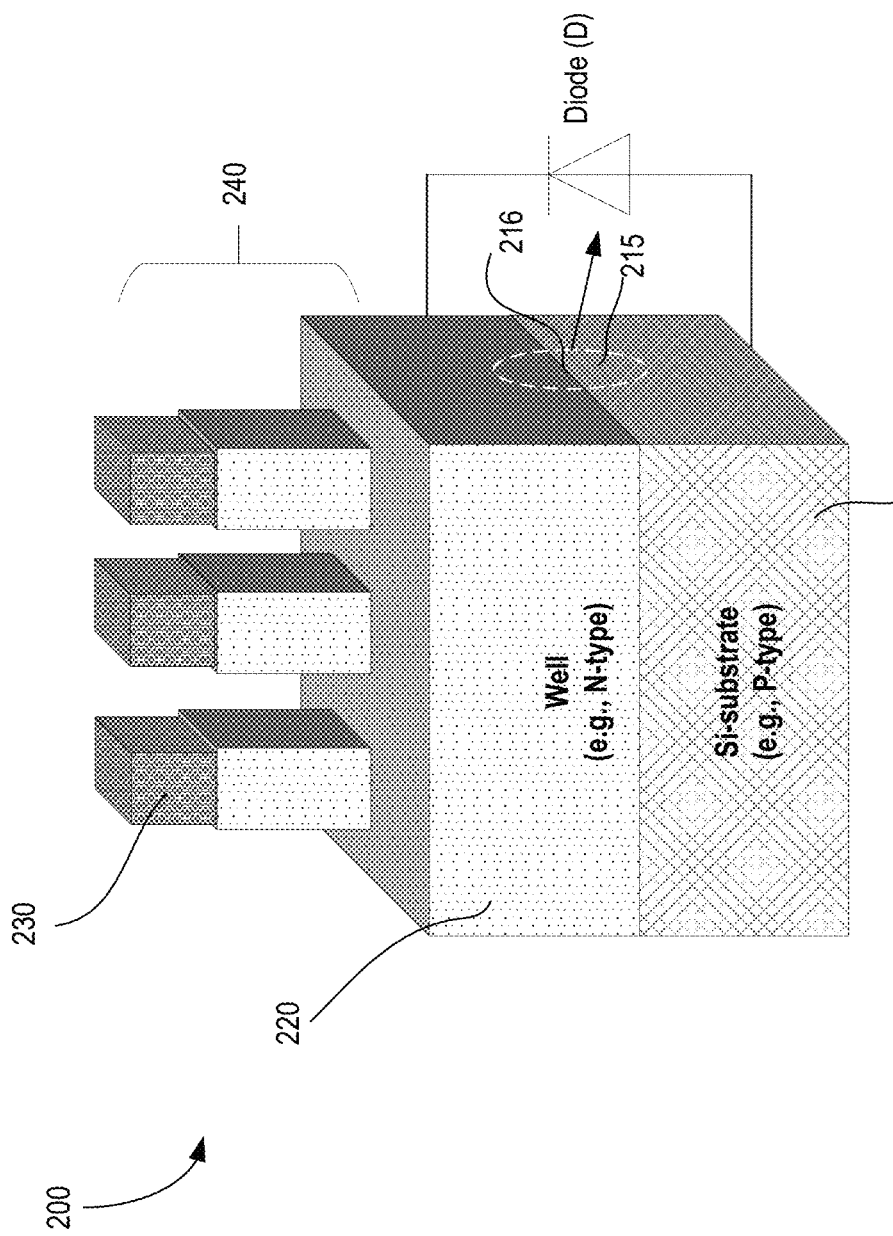
FIG. 2 illustrates a p-n junction diode, formed between a substrate and a well, for use in a thermal sensor, in accordance with some embodiments.

FIG. 2 illustrates an apparatus 200 showing a p-n junction diode D, formed between a substrate 210 and a well 220 (or portion 220), for use in a thermal sensor, in accordance with some embodiments. Apparatus 200 is used to form the diode D for the switch-capacitor based thermal sensor design. In some embodiments, apparatus 200 includes a substrate 210, a portion 220 directly contacting substrate 210, and portions 230. In some embodiments, substrate 210 can include p-type material (e.g., p-type silicon). Portion 220 can be part of a well (e.g., n-well) formed in or formed on substrate 210, such that portion 220 and substrate 210 have different types of materials. For example, portion 220 can include an n-type material (e.g., n-type silicon). In some embodiments, portions 230 and portion 220 can also have different types of materials that may form part of a transistor structure 240. For example, portions 220 can include a p-type material (e.g., p-type silicon material). Thus, substrate 210, portion 220, and portions 230 can have p-type, n-type, and p-type materials, respectively (e.g., p-type silicon, n-type silicon, and p-type silicon, respectively).

Transistor structure 240 can include multi-gate transistors (e.g., multi-gate field-effect transistors (FETs)). Examples of such multi-gate transistors include tri-gate transistors, finFETs, and other types of multi-gate transistors. Here, region 215 is formed by part of substrate 210 and part of portion 220 (e.g., part of an n-well). Region 215 has a junction 216 where part of substrate 210 directly contacts part of portion 220. Thus, junction 216 can include a p-n junction formed by p-type material of substrate 210 and n-type material of portion 220. This p-n junction forms the diode D which is used for implementing the switch capacitor based thermal sensor.

For simplicity, merely one diode D corresponding to one region 215 is shown. However, multiple diodes (e.g., similar to diode D) can be formed from multiple regions similar to region 215. For example, substrate 210 can include p-type material and different regions of substrate 210 can be doped with dopants of n-type material to form multiple n-type doped regions in substrate 210. The junctions (e.g., similar to junction 216) between the multiple n-type doped regions and substrate 210 can form multiple p-n junctions that can be part of multiple diodes. In such n-type doped regions, the size in one n-type doped region can be different from the size of another n-type doped region. This allows diodes formed from n-type doped regions in substrate 210 to have different current densities (e.g., different ratio-sized diodes). As such, multiple (e.g., two) diodes similar to diode D having different current densities (e.g., different sizes) can be formed in substrate 210 by forming different n-doped regions in substrate 210.

Figure 3:
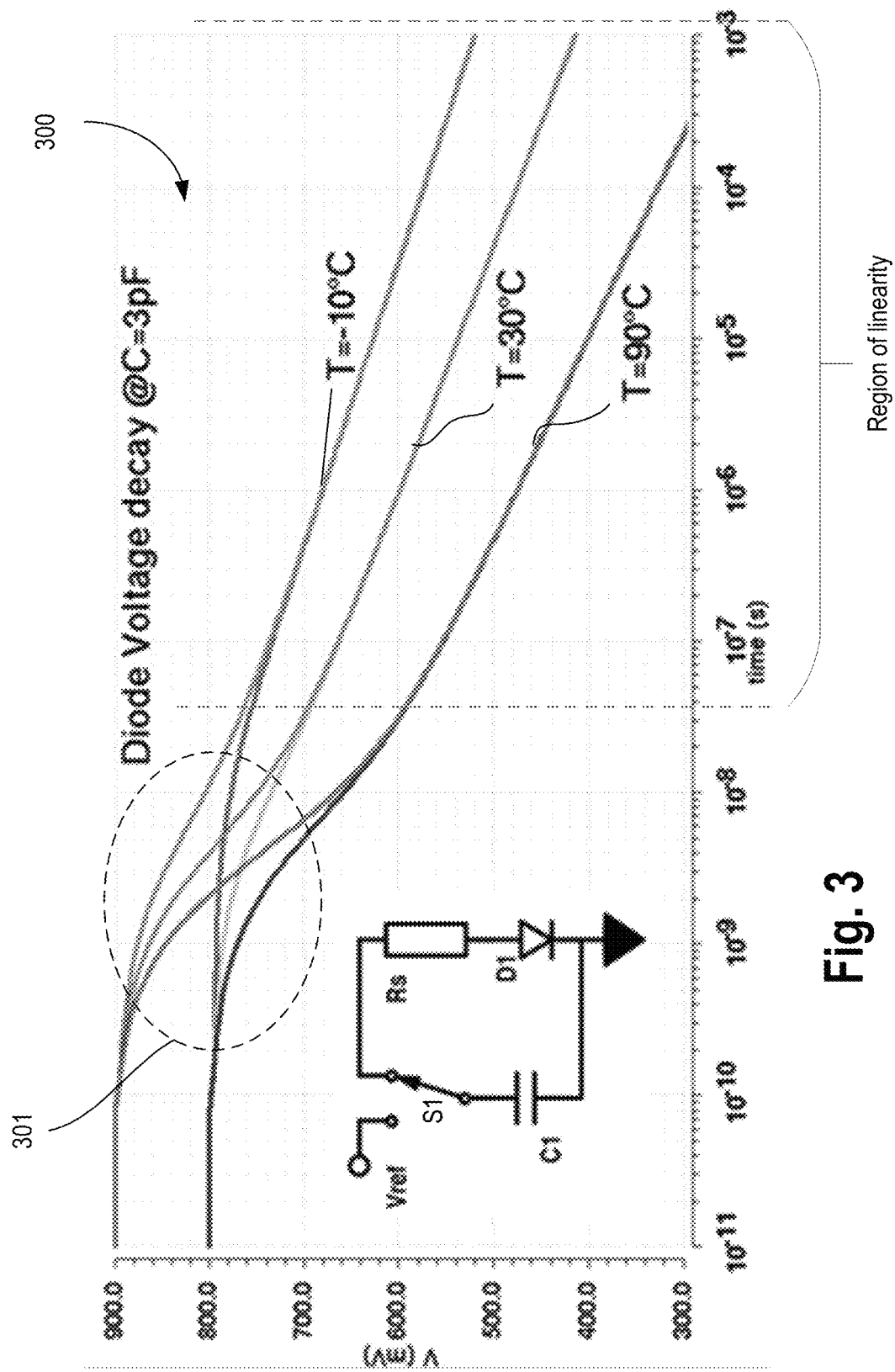
FIG. 3 illustrates a plot showing voltage decay for a switched capacitor coupled in parallel to a p-n junction diode, in accordance with some embodiments.

FIG. 3 illustrates a plot 300 showing voltage decay for a switched capacitor coupled in parallel to a p-n junction diode, in accordance with some embodiments. Here, the x-axis is time (in seconds (s)) and the y-axis is voltage on the capacitor C1. The circuit inside the plot is of a capacitive bias circuit which comprises capacitor C1, switch S1, reference node Vref, resistor Rs, and diode D1 coupled together as shown. The capacitive bias is applied to diode D1 instead of traditional technique through resistors or current sources. This results in a nearly digital circuit and allows to determine a current density precisely by timing control of switch S1. As such, the forward-diode voltage can be sampled with a capacitor, and huge current ratios are possible (e.g., N greater than 1000). In some embodiments, the extracted samples can be used to create signals with opposite temperature coefficient (PTAT and CTAT), where PTAT is proportional to absolute temperature and CTAT is the complementary to absolute temperature. In some embodiments, at a certain temperature Tx (to be measured), the PTAT and CTAT signals are equal, and this cross-over point is adjusted by either capacitor ratios or sampling time, and finally temperature Tx is calculated.

Plot 300 shows that for a major time period, the voltage of the diode (which is the voltage on capacitor C1) follows a strict logarithmic function versus time. This function does not depend on the initial bias or serial resistance due to low current levels. Therefore, by choosing sampling times (e.g., greater than 50 ns), the current density can be precisely controlled in accordance with some embodiments. Here, region 301 shows the non-linear behavior at three different temperatures (10 degrees C., 30 degrees C., and 90 degrees C.). This non-linear behavior is due to the resistance of resistor Rs. The voltage behavior then becomes linear providing a well-controlled circuit parameter for measuring temperature.

Figure 4:
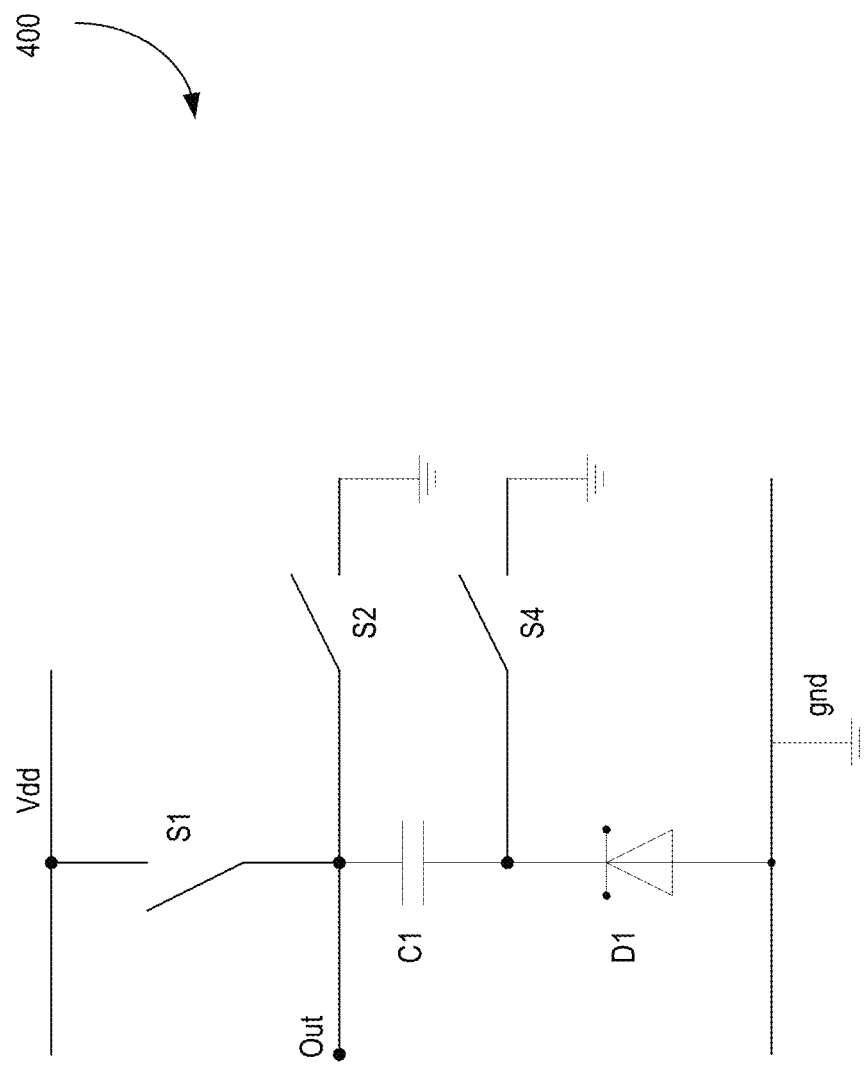
FIG. 4 illustrates a schematic of a switched capacitor network with a diode which is sampled by negative bias, in accordance with some embodiments.

FIG. 4 illustrates a schematic 400 of a switched capacitor network with a diode which is sampled by a negative bias, in accordance with some embodiments. Schematic 400 provides the basis of the temperature sensor circuit of various embodiments. The circuit of schematic 400 comprises diode D1, capacitor C1, switches S1, S2, and S4, supply node Vdd, and ground node gnd coupled together as shown. In some embodiments, since the n-well has the anode of the diode tied to the substrate, a negative voltage is used to forward-bias the diode D1. Various embodiments use a combined charge-pump and voltage sampling circuit to provide forward-bias to the diode. In some embodiments, capacitor C1 is charged to Vdd by closing switches S1 and S4 and opening switch S2. As such, the output "out" is charged to Vdd. The switches can be implemented as transistors (e.g., n-type, p-type, or a combination of them). In some embodiments, the capacitor C1 is discharged by closing switch S2 which couples "out" to ground, while opening switches S1 and S4. As such, a negative bias is provided to the cathode of diode D1. In other words, Vdd is pumped to a negative voltage level (−Vdd) at the cathode of diode D1 so that diode D1 is forward biased. One possible circuit for pumping the voltage to a negative level is described with reference to FIG. 9.

Figure 5:
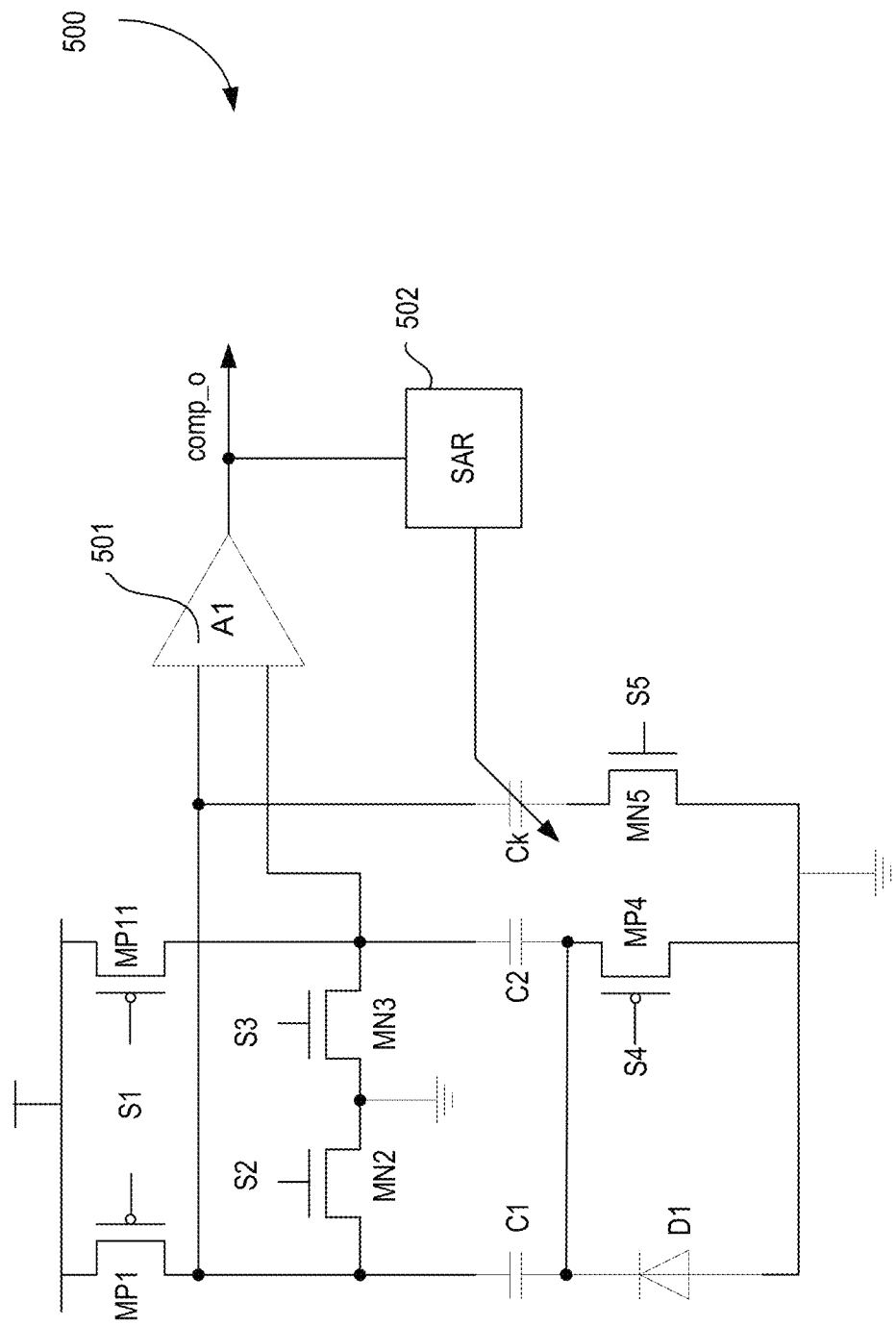
FIG. 5 illustrates a schematic of a thermal sensor with switched capacitor scheme, in accordance with some embodiments of the disclosure.

FIG. 5 illustrates a schematic of a thermal sensor 500 with switched capacitor scheme, in accordance with some embodiments of the disclosure. Thermal sensor 500 comprises p-type transistors MP1, MP11, and MP4, n-type transistors MN2, MN3, and MN4, capacitors C1, C2, and Ck, p-n diode D1, amplifier 501 (with gain A1), and successive approximation register (SAR) logic 502. FIG. 4 is a simplified version of the schematic of FIG. 5 where switches S1, S2, and S4 are replaced with p-type transistor MP1, n-type transistor MN2, and p-type transistor MP4, respectively. While the diode of various embodiments is illustrated as a simple p-n junction, it can be a variety of different kinds of diodes such as Schottky diode.

In some embodiments, transistors MP1 and MP11 are controlled by switching signal S1. In some embodiments, transistor MN2 is controlled by switching signal S2 while transistor S3 is controlled by switching signal S3. In some embodiments, transistor MP4 is controlled by switching signal S4 while transistor MN5 is controlled by switching signal S5. In some embodiments the signal S4 is redundant and transistor MN5 can be shorted. In some embodiments, one terminal of capacitor C1 is coupled to a first input of amplifier 501 while the other terminal of capacitor C1 is coupled to the cathode of diode D1. In some embodiments, one terminal of capacitor C2 is coupled to a second input of amplifier 501 while the other terminal of capacitor C2 is coupled to the cathode of diode D1. The cathode of diode D1 is coupled to gnd through transistor MP4, as shown. In various embodiments, capacitor Ck is a variable capacitor whose capacitance is modulated or changed by the output of SAR logic 502. In various embodiments, the output "comp_o" of amplifier 501 is received by SAR logic 502 which then controls the capacitance Ck to adjust a scaling factor 'k'. In some embodiments, capacitor Ck is binary weighted. In some embodiments, capacitor Ck is thermometer weighted.

Compared to traditional thermal sensors, here transistors MP1, MP11, MN2, MN3, MN4, and MN5 are digital transistors or switches which are controlled by a digital signal instead of an analog bias or an analog signal. An analog signal is any continuous signal for which the time varying feature (variable) of the signal is a representation of some other time varying quantity, i.e., analogous to another time varying signal. A digital signal is a physical signal that is a representation of a sequence of discrete values (a quantified discrete-time signal), for example of an arbitrary bit stream, or of a digitized (sampled and analog-to-digital converted) analog signal.

The switched capacitor scheme of various embodiments implements four phases, in accordance with various embodiments. In some embodiments, in the first phase, capacitors C1 and C2 are charged. For example, transistors MP1, MP11, and MP4 are closed by the logic levels of switching signals S1 and S4, respectively. In some embodiments, in the second phase, the voltage of capacitor C1 (e.g., V(C1)) is sampled. For example, capacitors C1 and C2 are discharged together, and capacitor Ck is also discharged. In this example, transistors MN2, MN3, and MN5 are closed by their respective controlling signals. In some embodiments, in the third phase, the voltage on capacitor C2 (e.g., V(C2)) is sampled. For example, capacitor C2 is discharged and the voltage of capacitor C1 is stored. In this example, merely transistor MN3 is closed by signal S3. In some embodiments, in the fourth phase, the voltage on capacitor C1 (e.g., V(C1)) is scaled by the charge on capacitor Ck. In this phase, one input of amplifier 501 receives V(C1)/k while the second input of the amplifier 501 receives V(C2). In this example, transistors MP4 and MN5 are closed.

Figure 7:
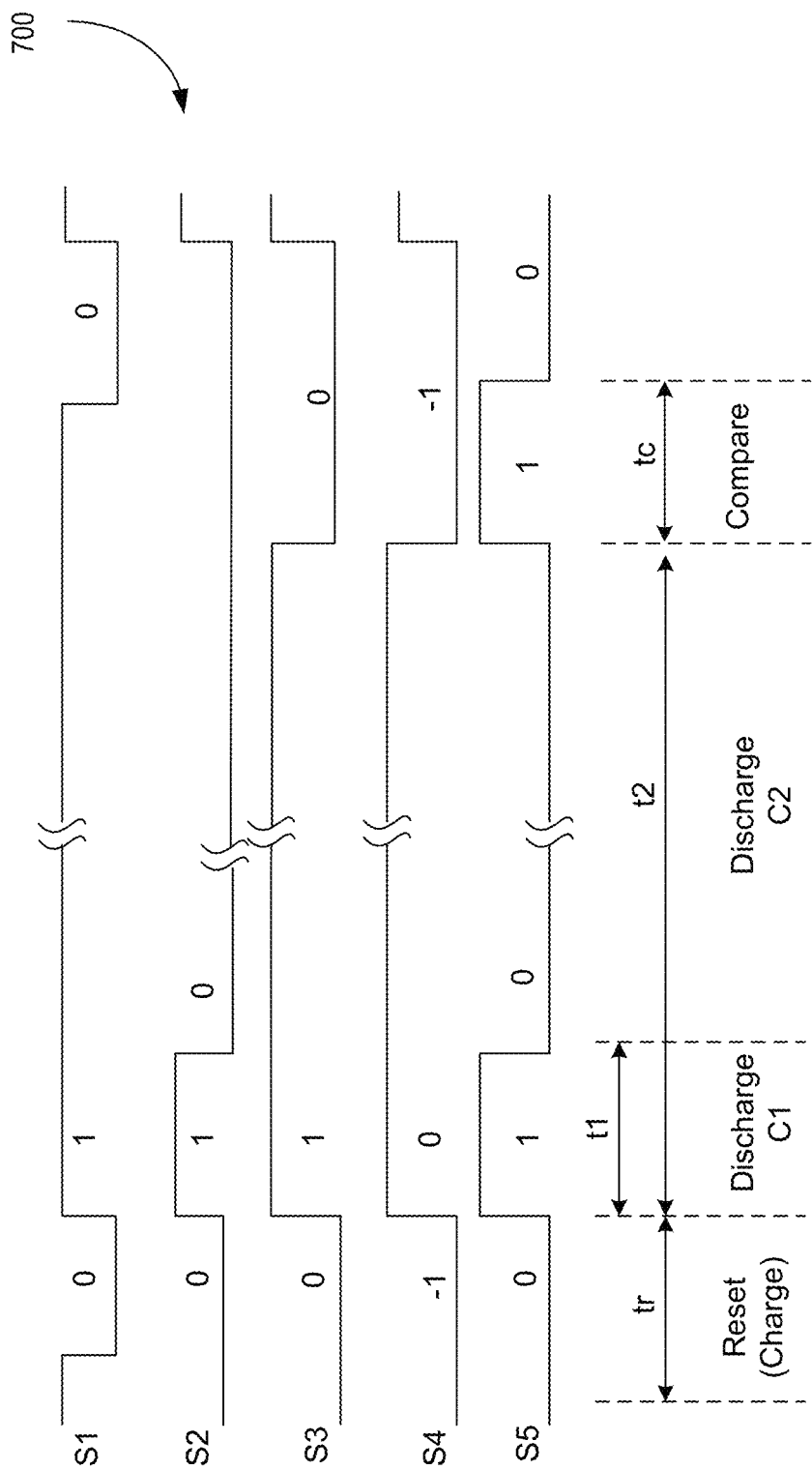
FIG. 7 illustrates a timing diagram of the switches of FIG. 5 to operate the thermal sensor, in accordance with some embodiments of the disclosure.

The timing diagram for the various phases of operation are shown with reference to FIG. 7. FIG. 7 illustrates a timing diagram 700 of the switches of FIG. 5 to operate the thermal sensor, in accordance with some embodiments of the disclosure. Here, the first phase is the charging phase during time period tr, the second phase is the discharging of capacitor C1 during time period t1, the third phase is the discharging of capacitor C2 during time period t2, and the fourth phase is the comparing phase in which V(C1) is compared with V(C2) during time tc. In some embodiments, a finite state machine (FSM) is provided which generates the switching signals S1, S2, S3, S4, and S5 to perform the various phases of operation.

The sequence of the operational phases brings a PTAT voltage (e.g., a positive temperature coefficient voltage) and a CTAT voltage (e.g., a negative temperature coefficient voltage) in equilibrium. For example:

$$Vctat = x \cdot Vptat \quad [1]$$

where 'x' is an adjustable voltage-scaling factor.

In some embodiments, for the CTAT part, the diode voltage is sampled at time t1 to provide:

$$Vctat = Vd(t1) = V_{G0}° \cdot t_c \cdot T \quad [2]$$

with $V_{G0}$ being the silicon bandgap and $t_c$ being the temperature coefficient.

In some embodiments, the PTAT part is extracted from the delta between the sampling points t1 and t2. Using the formula for capacitance voltage decay, the PTAT voltage can be expressed as:

$$Vptat = Vd(t1) - Vd(t2) = \eta \cdot V_T \cdot \ln\left(\frac{C1 \cdot t2}{C2 \cdot t1}\right) \quad [3]$$

With Vctat=x.Vptat, the temperature can be calculated as:

$$T_x = \frac{V_{G0}}{\eta \cdot \frac{K_B}{e} \cdot x \cdot \ln\left(\frac{C1 \cdot t2}{C2 \cdot t1}\right) - tc} \quad [4]$$

Using equations [2] and [3], with equilibrium condition [1], yields the scaling factor 'k' as:

$$Vd(t1) = \frac{x}{x-1} \cdot Vd(t2) \quad [5]$$

Figure 6:
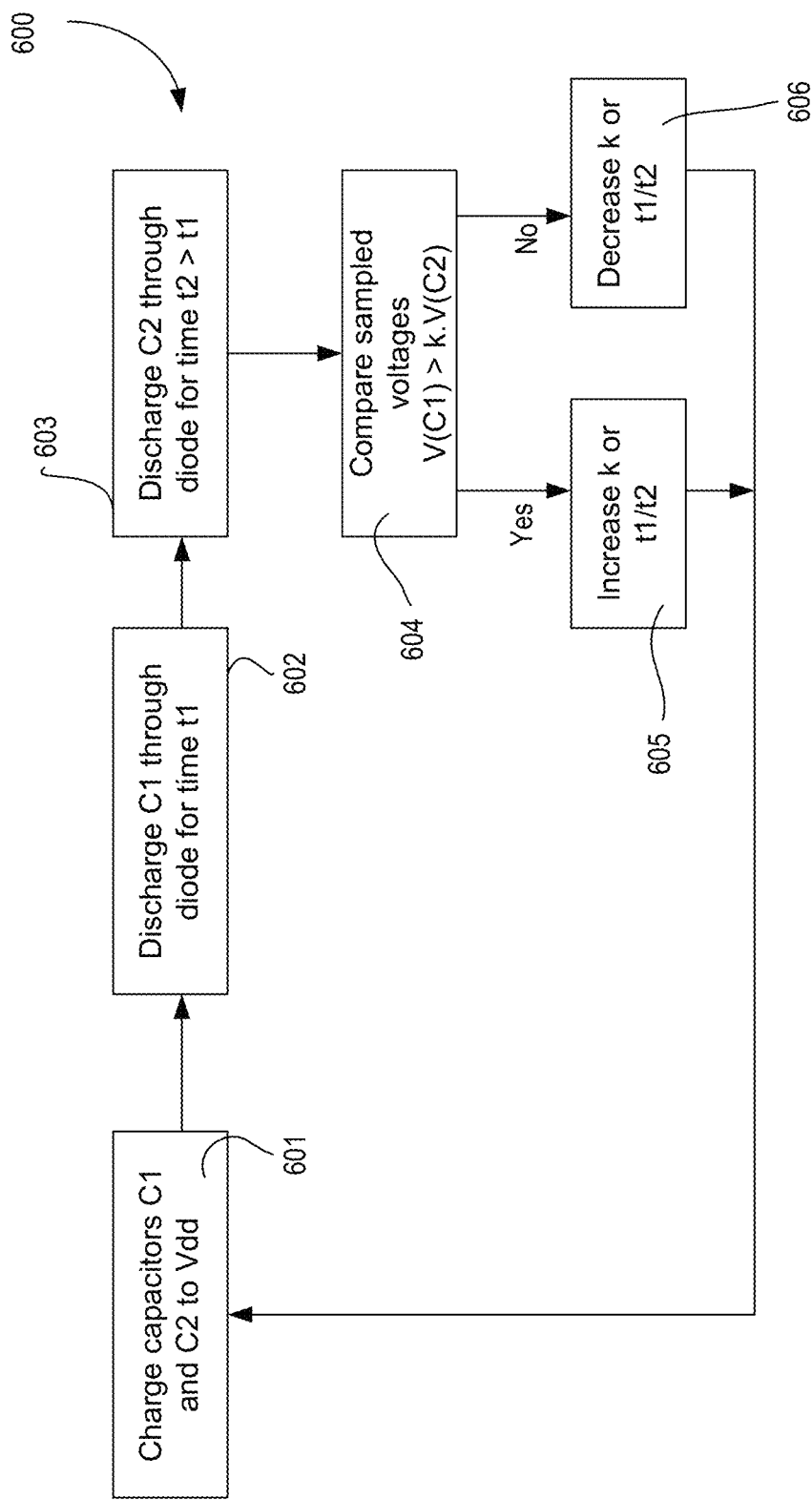
FIG. 6 illustrates a flowchart for operating the thermal sensor with the switched capacitor scheme, in accordance with some embodiments of the disclosure.

Then, according to flow chart in FIG. 6, the scaling factor 'k' is:

$$k = \frac{x}{x-1} \quad [6]$$

Referring back to FIG. 5, the third capacitor Ck is used to generate scaling factor 'k' by charge sharing during comparison. In some embodiments, the capacitor Ck is discharged initially (in phase2). In some embodiments, after the voltages of capacitor C1 and Ck are merged, then:

$$V(Ck) = V(C1) \cdot \frac{C1}{C1 + Ck} \quad [7]$$

where, $$\frac{C1}{C1 + Ck} = \frac{1}{k} \quad [8]$$

In some embodiments, amplifier 501 can be any comparator or amplifier with offset compensation. The resolution of the amplifier can be less than 0.4 mV, for example. In various embodiments, the capacitors can be implemented as metal capacitors. In some embodiments, the capacitors can be implemented as transistors. In some embodiments, the capacitors can be implemented as a combination of the metal capacitors and transistors.

FIG. 6 illustrates a flowchart 600 for operating the thermal sensor with the switched capacitor scheme, in accordance with some embodiments of the disclosure. The process begins by charging the capacitors C1 and C2 to a predefined voltage level (e.g., power supply level Vdd) as indicated by block 601. With reference to FIG. 5, capacitors C1 and C2 are charged by closing transistors MP1, MP11 and MP4. At block 602, capacitor C1 is discharged through diode D for time t1. With reference to FIG. 5, capacitor C1 is discharged by closing transistors MN2, MN3, and MP5. During this time, the voltage V(C1) on capacitor C1 is sampled. At block 603, capacitor C2 is discharged through diode D for time t2, where time t2 is greater than time t1. With reference to FIG. 5, when capacitor C2 is discharged, merely transistor MN3 is closed.

At block 604, the voltages of the two capacitors are sampled and compared by comparator (also referred to as an amplifier) 501. For example, a determination is made whether V(C1) is greater than a product of scaling factor 'k' and V(C2). The output "comp_o" of comparator 501 is received by SAR logic 502 which decides to adjust the scaling factor 'k' by changing the capacitance of capacitor Ck. For example, when V(C1) is greater than the product of scaling factor 'k' and V(C2), then at block 605 the value of 'k is increased. Likewise, when V(C1) is less than or equal to the product of scaling factor 'k' and V(C2), then at block 606 the value of 'k is decreased. The process then continues to block 601. While block 604 compares V(C1) to the product of scaling factor 'k' and V(C2), the comparison can also be made between 1/k times V(C1) and V(C2). In this example, if the product of 1/k and V(C1) is greater than V(C2), then the process proceeds to block 605, otherwise the process proceeds to block 606.

In some embodiments, alternative to adjusting the factor 'k', the time ratio of t1/t2 can be increased or decreased, at block 605 and block 606, respectively, within the same procedure as described above. Here, the times t1 and t2 correspond to current density. For example, the ratio of times t1 and t2 correspond to PTAT.

Figure 8:
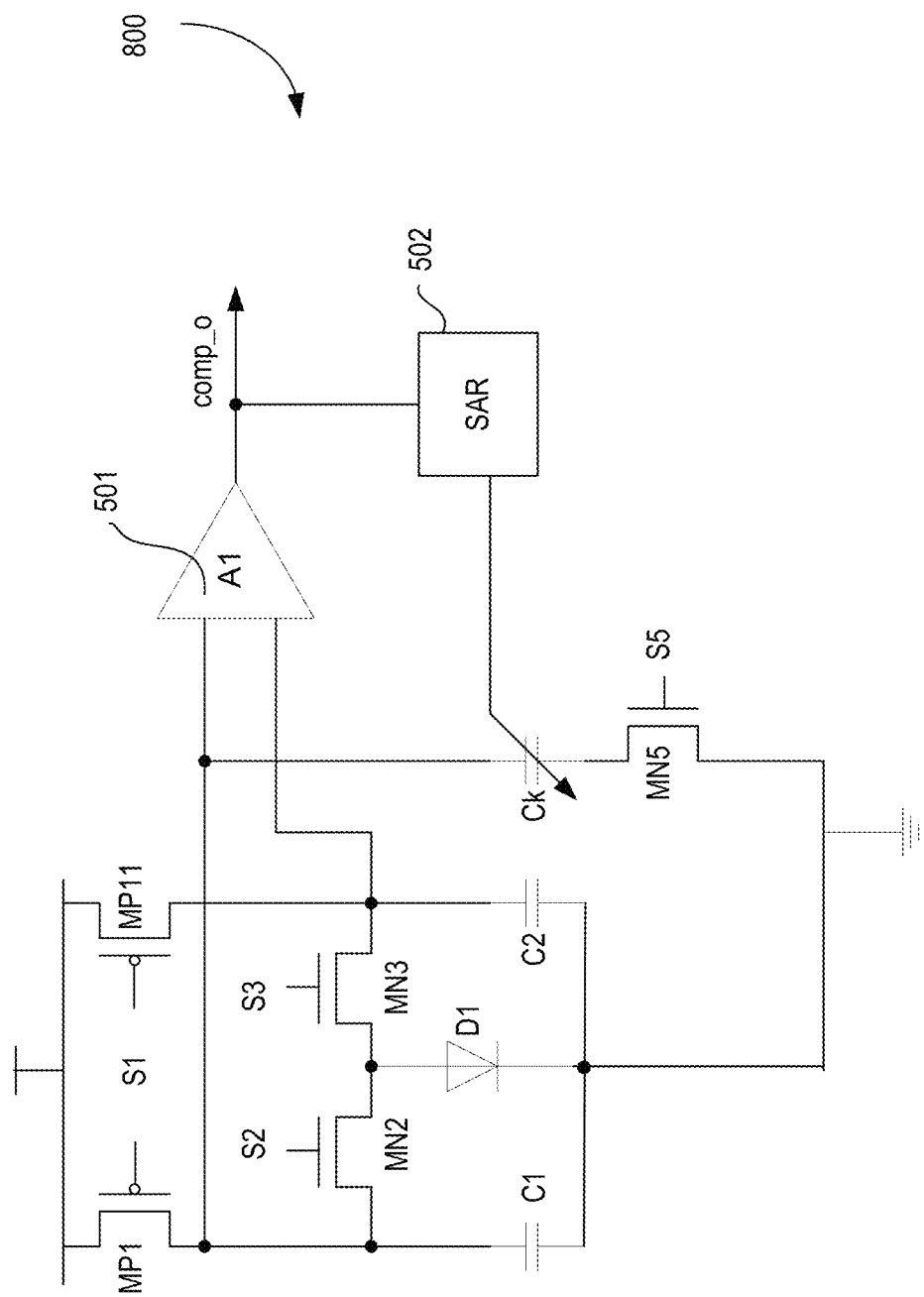
FIG. 8 illustrates a schematic of a thermal sensor with the switched capacitor scheme, in accordance with some embodiments of the disclosure.

FIG. 8 illustrates a schematic of a thermal sensor 800 with switched capacitor scheme, in accordance with some embodiments of the disclosure. Thermal sensor 800 is an alternate design which comprises p-type transistors MP1 and MP11, n-type transistors MN2, MN3, and MN5, capacitors C1, C2, and Ck, diode D1, amplifier (or comparator) 501, and SAR logic 502 coupled together as shown. In various embodiments, the phases of operation are identical to those discussed with reference to FIG. 5, but with MP4 and corresponding signal S4 omitted. In accordance with some embodiments of the disclosure, the diode D1 does not have the anode tied to substrate, but is a 'floating diode' available in a silicon process.

Figure 9:
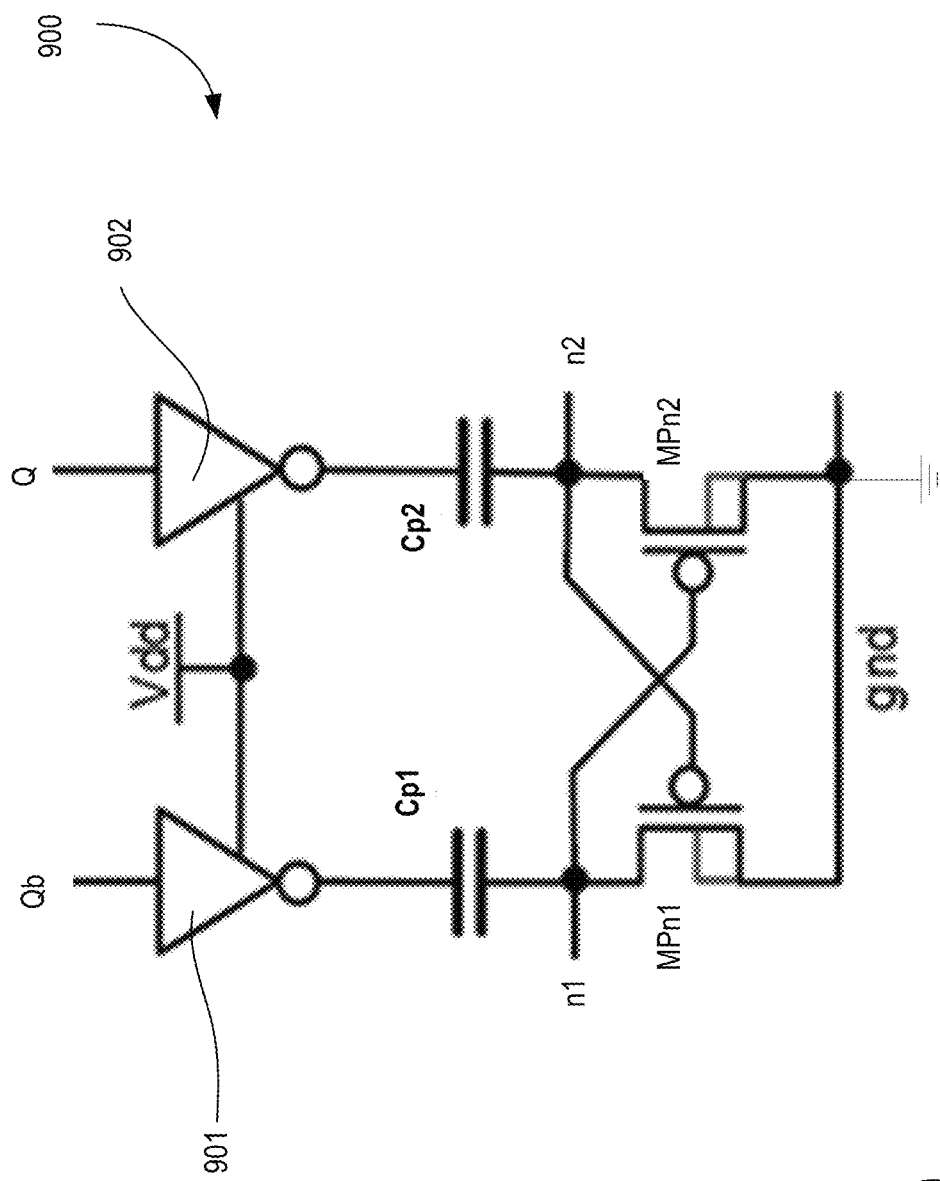
FIG. 9 illustrates a schematic of a negative clock boosting circuit for use in the thermal sensor, in accordance with some embodiments of the disclosure.

FIG. 9 illustrates a schematic of a negative clock boosting circuit 900 for use in the thermal sensor, in accordance with some embodiments of the disclosure. The negative clock boosting circuit 900 comprises inverters 901 and 902, capacitors Cp1 and Cp2, and cross-coupled transistors MPn1 and MPn2 coupled together as shown. Here, the inputs Q and Qb are switching complementary signals while the outputs are provided at nodes n1 and n2. As discussed with reference to FIG. 5, transistor MP4 that is controllable by switching signal S4 is exposed to a negative drain voltage. As such, transistor MP4 is realized by a p-type device to avoid latch-up. The gate terminal of transistor MP4 is driven from a negative signal that is level-shifted by −Vdd, which can be generated by negative clock boosting circuit 900, in accordance with some embodiments.

Figure 10:
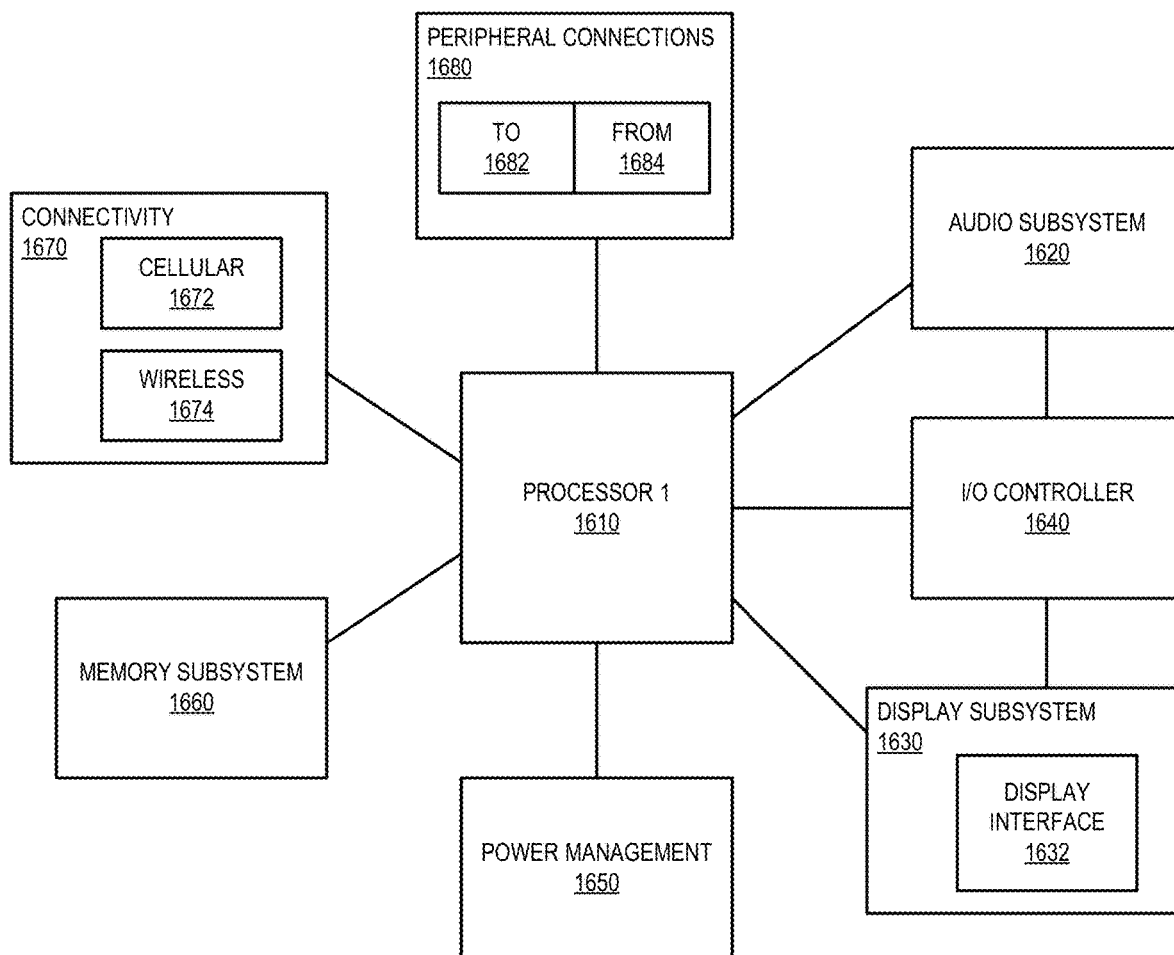
FIG. 10 illustrates a smart device or a computer system or a SoC (System-on-Chip) having a thermal sensor, according to some embodiments of the disclosure.

FIG. 10 illustrates a smart device or a computer system or a SoC (System-on-Chip) having a thermal sensor, according to some embodiments of the disclosure. The block diagram is, for example, of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having the thermal sensor circuit, according to some embodiments discussed. Other blocks of the computing device 1600 may also include the thermal sensor circuit, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   circuitry to:
      charge first and second capacitors to a predetermined voltage level;
      discharge the first capacitor through a diode at a first time; and
      discharge the second capacitor through the diode at a second time, wherein the second time is greater than the first time;
   a comparator coupled to the circuitry, the comparator to compare a first voltage of the first capacitor with a second voltage of the second capacitor; and
   logic coupled to the comparator, the logic to adjust a scaling factor applied to the second voltage according to an output of the comparator.

2. The apparatus of claim 1, wherein the logic is to increase the scaling factor when the first voltage is greater than a product of a previous value of the scaling factor and the second voltage.

3. The apparatus of claim 1, wherein the logic is to decrease the scaling factor when the first voltage is less than or equal to a product of a previous value of the scaling factor and the second voltage.

4. The apparatus of claim 1, wherein the diode comprises a p-n junction between a silicon substrate and a well.

5. The apparatus of claim 1, wherein the logic comprises a successive approximation register.

6. A system comprising:
   a memory;
   a processor coupled to the memory, the processor including a thermal sensor circuit which includes:
      circuitry to:
         charge first and second capacitors to a predetermined voltage level;
         discharge the first capacitor through a diode at a first time; and
         discharge the second capacitor through the diode at a second time, wherein the second time is greater than the first time;
      a comparator coupled to the circuitry, the comparator to compare a first voltage of the first capacitor with a second voltage of the second capacitor; and
      logic coupled to the comparator, the logic to adjust a scaling factor applied to the second voltage according to an output of the comparator; and
   a wireless interface to allow the processor to communicate with another device.

7. The system of claim 6, wherein the diode is positioned near a hot spot of the processor.

8. The system of claim 6, wherein the processor comprises a finite state machine to control timing of turning on one or more devices of the circuitry.

9. The system of claim 6, wherein the logic comprises a successive approximation register.

10. The system of claim 6, wherein the logic is to increase the scaling factor when the first voltage is greater than a product of a previous value of the scaling factor and the second voltage.

11. The system of claim 6, wherein the logic is to decrease the scaling factor when the first voltage is less than or equal to a product of a previous value of the scaling factor and the second voltage.

12. The system of claim 6, wherein the diode comprises a p-n junction between a silicon substrate and a well.

13. An apparatus comprising:
   a comparator to compare a first voltage of a first capacitor with a second voltage of a second capacitor; and
   logic coupled to the comparator, the logic to adjust a scaling factor applied to the second voltage according to an output of the comparator, wherein the logic is to adjust the scaling factor according to the first voltage and a product of a previous value of the scaling factor and the second voltage.

14. The apparatus of claim 13, wherein the logic is to increase the scaling factor when the first voltage is greater than the product of a previous value of the scaling factor and the second voltage.

15. The apparatus of claim 13, wherein the logic is to decrease the scaling factor when the first voltage is less than or equal to the product of a previous value of the scaling factor and the second voltage.

16. The apparatus of claim 13, further comprising a circuitry coupled to the comparator, wherein the circuitry is to charge the first capacitor and the second capacitor to a predetermined voltage level.

17. The apparatus of claim 16, wherein the circuitry discharges the first capacitor through a diode at a first time.

18. The apparatus of claim 17, wherein the circuitry is to discharge the second capacitor through the diode at a second time, wherein the second time is greater than the first time.

19. The apparatus of claim 18, wherein the diode comprises a p-n junction between a silicon substrate and a well.

* * * * *